(12) United States Patent
Chang et al.

(10) Patent No.: US 9,536,885 B2
(45) Date of Patent: Jan. 3, 2017

(54) HYBRID FINFET/NANOWIRE SRAM CELL USING SELECTIVE GERMANIUM CONDENSATION

(71) Applicant: International Business Machines Corporation, Armonk, NY (US)

(72) Inventors: Josephine B. Chang, Bedford Hills, NY (US); Leland Chang, New York, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/672,282

(22) Filed: Mar. 30, 2015

(65) Prior Publication Data

US 2016/0293610 A1 Oct. 6, 2016

(51) Int. Cl.
| | |
|---|---|
| *H01L 27/11* | (2006.01) |
| *H01L 27/12* | (2006.01) |
| *H01L 27/092* | (2006.01) |
| *H01L 21/84* | (2006.01) |
| *H01L 29/06* | (2006.01) |
| *H01L 29/41* | (2006.01) |

(52) U.S. Cl.
CPC ......... *H01L 27/1108* (2013.01); *H01L 21/845* (2013.01); *H01L 27/0922* (2013.01); *H01L 27/0924* (2013.01); *H01L 27/1211* (2013.01); *H01L 29/0673* (2013.01); *H01L 29/413* (2013.01)

(58) Field of Classification Search
None
See application file for complete search history.

(56) References Cited

U.S. PATENT DOCUMENTS

| | | |
|---|---|---|
| 8,053,299 B2 | 11/2011 | Xu |
| 8,117,436 B2 | 2/2012 | Zhang et al. |
| 8,216,902 B2 | 7/2012 | Chang et al. |
| 8,349,667 B2 | 1/2013 | Saracco et al. |
| 8,395,220 B2 | 3/2013 | Chang et al. |
| 8,536,029 B1 * | 9/2013 | Chang et al. ......... H01L 21/845 257/29 |

(Continued)

OTHER PUBLICATIONS

Bangsaruntip et al., "High Performance and Highly Uniform Gate-All-Around Silicon Nanowire MOSFETs with Wire Size Dependent Scaling", 2009 IEEE International Electron Devices Meeting (IEDM), Dec. 7-9, 2009, Baltimore, MD, DOI: 10.1109/IEDM.2009.5424364, 4 pages, © 2009 IEEE.

*Primary Examiner* — Daniel Luke
(74) *Attorney, Agent, or Firm* — Gilbert Harmon, Jr.

(57) ABSTRACT

A semiconductor device including a pFET and an nFET where: (i) the gate and conductor channel of the pFET are electrically insulated from a buried oxide layer; and (ii) the conductor channel of the nFET is in the form of a fin extending upwards from, and in electrical contact with, the buried oxide layer. Also, a method of making the pFET by adding a fin structure extending from the top surface of the buried oxide layer, then condensing germanium locally into the lattice structure of the lower portion of the fin structure, and then etching away the lower portion of the fin structure so that it becomes a carrier channel suspended above, and electrically insulated from the buried oxide layer.

11 Claims, 27 Drawing Sheets

(56) References Cited

U.S. PATENT DOCUMENTS

| | | |
|---|---|---|
| 2011/0012090 A1 | 1/2011 | Singh et al. |
| 2011/0233512 A1 | 9/2011 | Yang et al. |
| 2013/0105897 A1* | 5/2013 | Bangsaruntip ......... B82Y 10/00 257/351 |
| 2013/0153993 A1* | 6/2013 | Chang et al. .......... B82Y 10/00 257/330 |

* cited by examiner

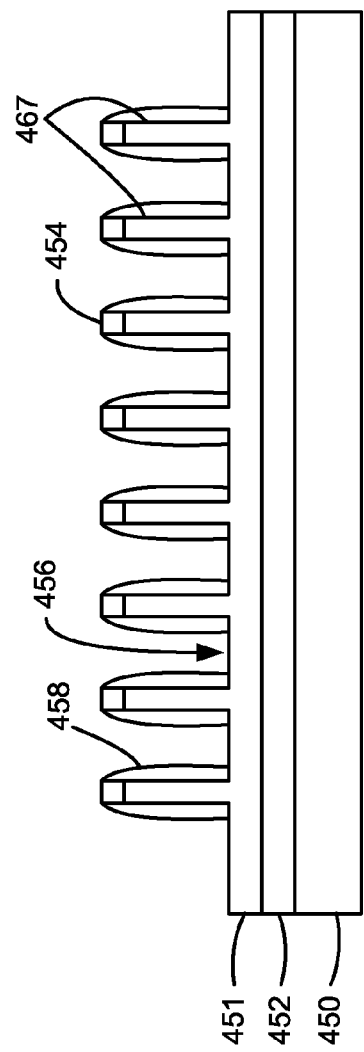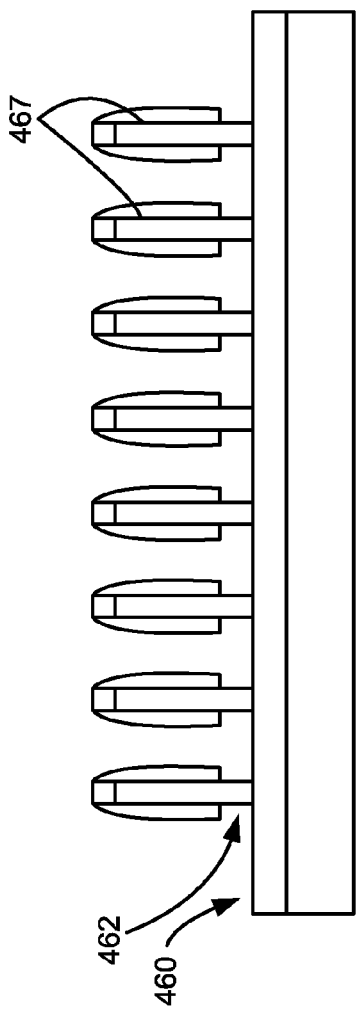

HYBRID FINFET/NANOWIRE SRAM CELL USING SELECTIVE GERMANIUM CONDENSATION

BACKGROUND OF THE INVENTION

The present invention relates generally to the field of SRAM (static random access memory) cells, and more particularly to SRAM cells including a FINFET (field-effect transistor(s) that include fin structure(s) and nanowire(s) passing transversely through the fin.

SRAMs that use FINFETs are known. In FINFET-style SRAMs, one, or more, elongated fin structures, which are relatively tall in height and relatively thin in the transverse direction, are used to carry charge away from the gate(s) of transistor(s) for improved transistor electrical performance.

SUMMARY

According to an aspect of the present invention, a semiconductor device includes: (a) a buried oxide layer (BOX); (b) a first pFET (p-type field-effect transistor) device including a source, a drain, a gate and a conducting channel, with the semiconductor conducting channel extending from the source to the drain and being in electrically conductive contact with the gate; and (c) a first nFET (n-type field effect transistor) device including a source, a drain, a gate, a gate and a conducting channel, with the semiconductor conducting channel extending from the source to the drain and being in electrically conductive contact with the gate. The conducting channel of the first pFET device is: (i) located above the BOX, and (ii) substantially electrically insulated from the BOX. The conducting channel of the first nFET device is in the form of a fin extending upwards from, and in electrically conductive contact with, the BOX.

According to a further aspect of the present invention, a static random-access memory (SRAM) cell device includes: (a) a buried oxide layer (BOX); (b) a first pFET (p-type field-effect transistor) device including a source, a drain, a gate and a conducting channel, with the semiconductor conducting channel extending from the source to the drain and being in electrically conductive contact with the gate; and (c) a first nFET (n-type field effect transistor) device including a source, a drain, a gate, a gate and a conducting channel, with the semiconductor conducting channel extending from the source to the drain and being in electrically conductive contact with the gate. The conducting channel of the first pFET device is: (i) located above the BOX, and (ii) substantially electrically insulated from the BOX. The conducting channel of the first nFET device is in the form of a fin extending upwards from, and in electrically conductive contact with, the BOX.

According to a further aspect of the present invention, a method of making a semiconductor device includes the following steps (not necessarily in the following order): (a) providing a buried oxide layer (BOX) having a top surface; (b) adding a fin structure extending upwards from the top surface of the BOX, with the fin structure being made of silicon and/or silicon-germanium (SiGe); (c) locally condensing germanium into a lower portion of the fin structure proximate to the top surface of the BOX; and (d) etching away the lower portion of the fin structure so that the fin structure is spaced away from the top surface of the BOX.

BRIEF DESCRIPTION OF THE DRAWINGS

FIG. 4A is a cross-sectional "slice" view (cross-hatching omitted for clarity of illustration purposes), cutting transversely across the gate structures, of a fourth embodiment of circuitry according to the present invention taken at an intermediate stage in the fabrication process;

FIG. 4B is a cross-sectional "slice" view (cross-hatching omitted for clarity of illustration purposes), cutting transversely across the gate structures, of the fourth embodiment circuitry taken at another intermediate stage in the fabrication process;

DETAILED DESCRIPTION

Figure 1:
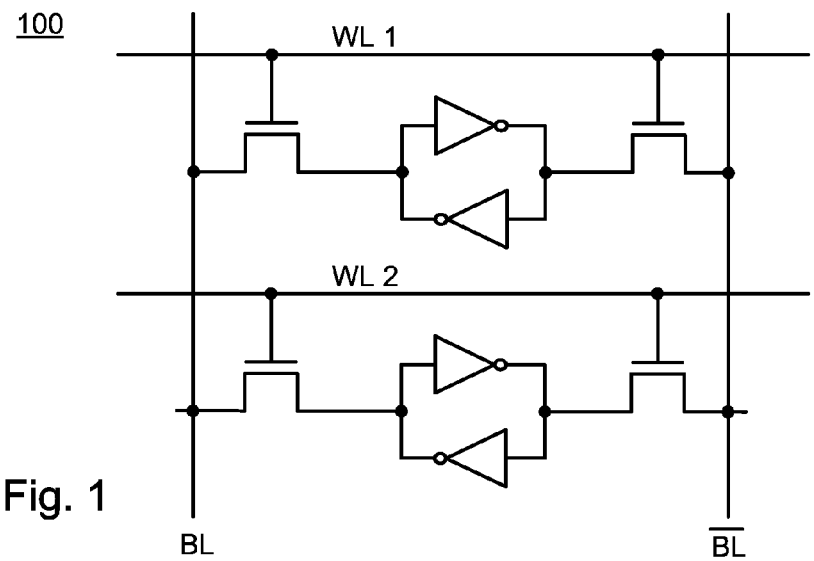
FIG. 1 is an electrical schematic of a first embodiment of a circuit according to the present invention.

Some embodiments of the present invention are directed to a set of FINFET/nanowire hybrid transistors that use localized germanium condensation to form one, or more, "release point(s)." The release points are selectively located so that: (i) some longitudinal portions of the fin structures have their base portions removed (that is, released) so that the top portion of the fin (herein sometimes called "suspended fin top portions" or "suspended nanowire portions") is suspended over, and spaced apart from, the buried oxide layer; and (ii) some longitudinal portions of the fin structures (sometimes herein referred to as "fin portions") remain intact so that they extend down to the buried oxide layer. In some embodiments, Germanium (Ge) condensation is used at the base of fin portions which are to be released. More specifically, by using Ge condensation to make the base of a fin relatively rich in Germanium, this allows the base to be selectively etched away without etching away the suspended top fin portion. One application for the FINFET/nanowire hybrid transistor sets according to the present invention is FINFET/nanowire hybrid SRAMs. The "suspended fin top portions" are also referred to as "suspended nanowire portions" because the suspended fin top portions become suspended nanowires when their base portions are removed.

Some embodiments of the present invention may provide a FINFET-based SRAM cell, where it is relatively easy to relatively precisely tune the "beta ratio." The beta ratio is the ratio of conductivity of a pull-down device to the conductivity of a pass-gate device of the SRAM cell. Specifically, for FINFET-based SRAM cells, the PFET (p-type FET) tends to be too strong, meaning that the PFET drive strength is too large relative to NFET (n-type FET) drive strength. The beta ratio is related to the $W_{eff}$ value for p-type FIN-FETs. Adjustment of the device width, as is typically done to tune the beta ratio in planar CMOS (complementary metal-oxide-semiconductor), is not typically a feasible way to tune the beta ratio in a FINFET-based SRAM cell, and some embodiments of the present invention allow tuning of the beta ratio without the need to adjust width. Also, tuning the beta ratio by weakening the PFET with dopants (that is, the use of $V_t$ implants) is typically considered to be undesirable from a standpoint of variation (RDF (random dopant fluctuation)), and some embodiments of the present invention allow tuning of the beta ratio without the use of $V_t$ implants and potential associated RDF issues.

Some embodiments of the present invention provide an SRAM including transistors having gates made from nanowire which may lead to performance and density advantages with respect to other conventional SRAM designs.

Some embodiments of the present invention use Germanium (Ge) condensation. Ge condensation involves migrating Germanium atoms from one part of a Silicon-Germanium (SiGe) physical structure to another part based upon the fact that Si and Ge have the same crystalline structure (and are therefore miscible), but have different chemical affinities with respect to Oxygen (O). Ge condensation is a technique that allows good control over the proportion of Ge atoms in a relatively small SiGe region of a semiconductor device.

Some embodiments of the present invention make a FINFET/nanowire hybrid SRAM (static random access memory) cell using a local germanium condensation to form a release point. In some embodiments, the local germanium condensation is selectively located so that: (i) some longitudinal portions of fin structures (for example, PFETs (p-type field effect transistors) of the SRAM cell) are suspended at the release point (suspended nanowire portions); and (ii) other longitudinal portions of the fin structures are not suspended. In this document, a "FINFET/nanowire hybrid SRAM cell" means an SRAM cell that includes fin shaped active gates and nanowires passing through the fin structures in order to help form the NFETs and PFETs of the SRAM, where at least one fin structure has been modified to include: (i) at least one suspended nanowire portion; and (ii) at least one fin portion.

Some embodiments of the present invention provide a selective release of the PFETs, in a set NFHTs, in order to: (i) decrease $W_{eff}$ values for the PFETs, and (ii) reduce drive strength of the PFET regions (which are typically subject to release and suspension) relative to drive strength of the NFET regions (which are typically not subject to release and suspension).

As shown in FIG. 1, device 100 (shown as a circuit diagram) is a SRAM cell circuit diagram to which embodiments of the present invention may be applied. Device 100 includes word lines WL1, WL2, and bit lines BL and BL-overscore.

Figure 2:
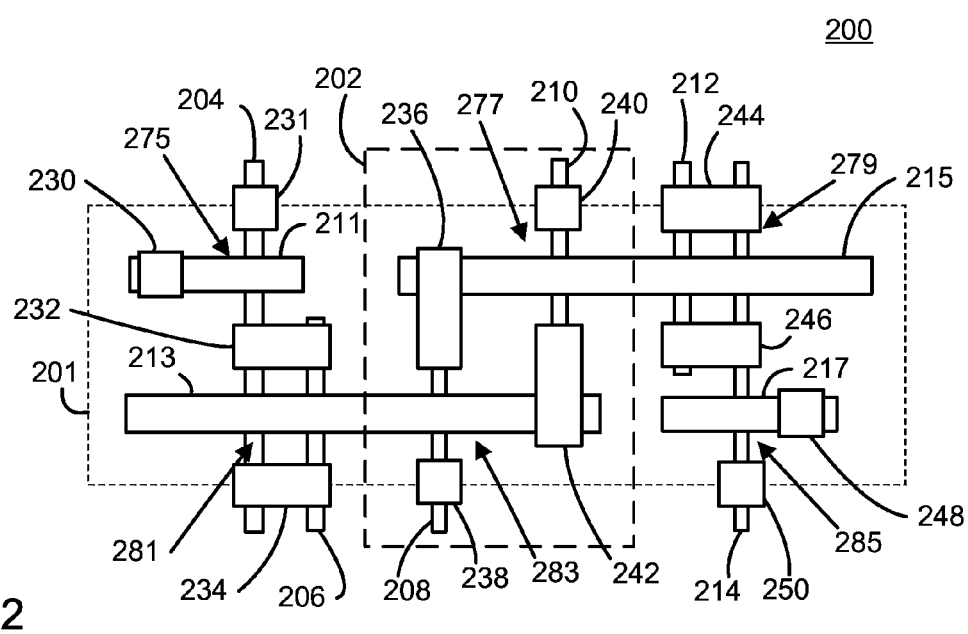
FIG. 2 is a block diagram of a second embodiment of circuitry according to the present invention with cross-hatching patterns used to distinguish the different types of circuitry components.

As shown in FIG. 2, device 200 (shown in plan view) is an embodiment of a hybrid III-V 6 transistor FINFET SRAM cell. Device 200, substantially located inside cell boundary 201, includes: N-well 202; active structures (or fin structures) 204, 206, 208, 210, 212, 214; gates 211, 213, 215, 217; contacts 230, 231, 232, 234, 236, 238, 240, 242, 244, 246, 248, 250; first pass-gate region 275 (a fin portion of fin structure 204); first pull-up region 277 (a suspended nanowire portion of fin portion 210); first pull-down region 279 (a fin portion of fin structure 214); second pull-down region 281 (a fin portion of fin structure 204); second pull-up region 283 (a suspended nanowire portion of fin structure 208); and second pass-gate region 285 (a fin portion of fin structure 214).

Figure 3A:
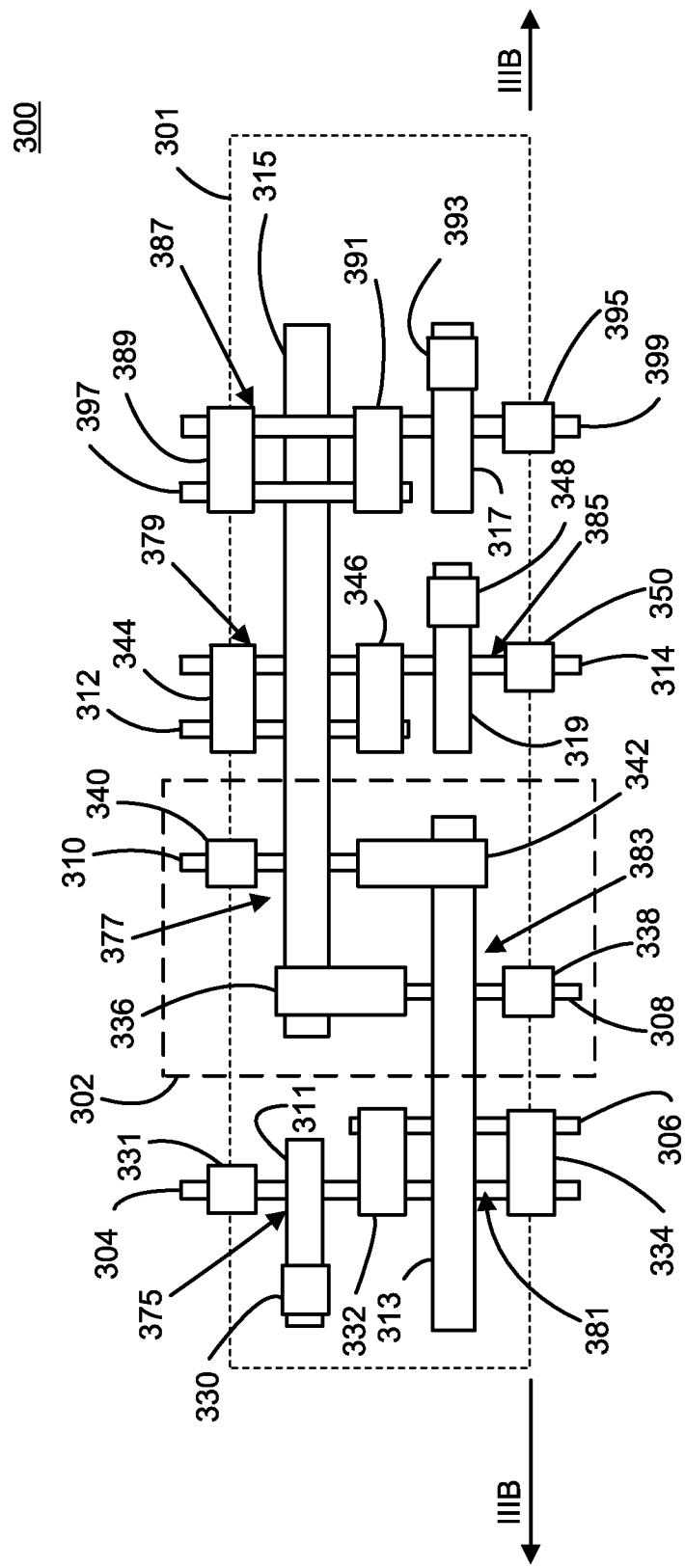
FIG. 3A is a block diagram of a third embodiment of circuitry according to the present invention with cross-hatching patterns used to distinguish the different types of circuitry components.

As shown in FIG. 3A, device 300 (shown in plan view) is an embodiment of a hybrid III-V 8-transistor FINFET TFET (tunnel field effect transistor) SRAM cell where: (i) portions of some fin structures run longitudinally through the pull-up regions, and the portions of the fin structures that run through pull-up regions are released so that they become suspended nanowire(s) portions; and (ii) the remainder of the fin structures and/or portions of fin structures remain in non-suspended form. Device 300, substantially located inside cell boundary 301, includes: N-well 302; active fin structures 304, 306, 308, 310, 312, 314, 397, 399; gates 311, 313, 315, 317, 319; contacts 330, 331, 332, 334, 336, 338, 340, 342, 344, 346, 348, 350, 389, 391, 393, 395; first pass-gate region 375 (fin portion); first pull-up region 377 (suspended nanowire portion); first pull-down region 379 (fin portion); second pull-down region 381 (fin portion); second pull-up region 383 (suspended nanowire portion); second pass-gate region 385 (fin portion); and read stack 387 (fin portion).

Figure 3B:
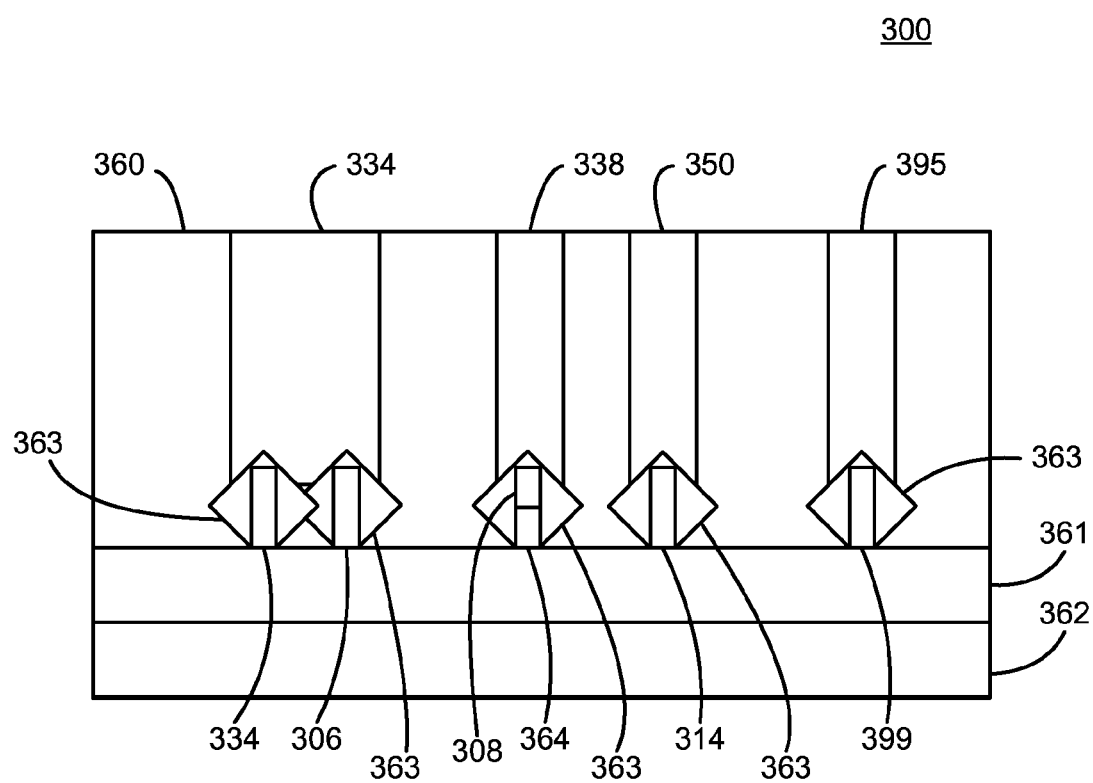
FIG. 3B is a cross-sectional "slice" view (cross-hatching omitted for clarity of illustration purposes), cutting transversely across the gate structures, of the third embodiment circuitry.

FIG. 3B shows a cross-sectional "slice" (cross-hatching omitted for clarity of illustration purposes) of device 300 as indicated by the IIIB section arrows in FIG. 3A. As further shown in FIG. 3B, the device at the intermediate stage of fabrication shown in FIG. 3B further includes: interlayer dielectric layer 360; buried oxide layer ("BOX") 361; substrate layer 362; raised source/drain regions 363; and Germanium-rich fin structure portion 364. More specifically, this slice, shown in FIG. 3B, is as the device exists at an intermediate stage of the fabrication process (to be further discussed, below), which occurs: (i) subsequent to the germanium condensation that makes germanium-rich release portion 364 of fin structure 308; and (ii) prior to the release (that is, removal) of germanium-rich portion 364 so that fin structure 308 includes the suspended nanowire portion of pull-up region 383 (see FIG. 3A). As will be discussed in more detail, below, in this embodiment, Ge-rich portion 364 is made by selectively performing Ge condensation over select longitudinal lengths of the lateral walls at the base on the fin structure. It is noted that FIGS. 3A and 3B are not necessarily drawn to a common horizontal scale.

A fin-base-removal process which is a portion of a larger semiconductor fabrication process, specifically, a process portion where certain base portion(s) of the fin are removed to create "suspended fin portions" (also called "suspended nanowire portions"), will now be discussed with reference to FIGS. 4A to 6.

Figure 4C:
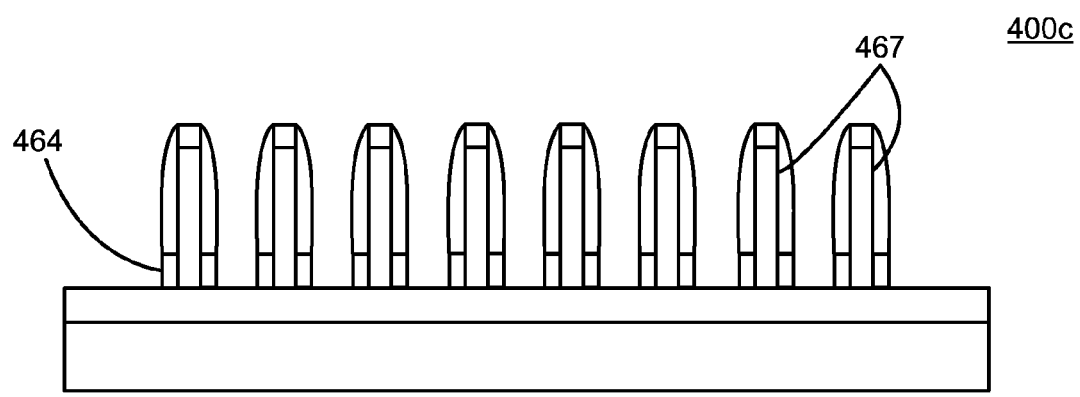
FIG. 4C is a cross-sectional "slice" view (cross-hatching omitted for clarity of illustration purposes), cutting transversely across the gate structures, of the fourth embodiment circuitry taken at another intermediate stage in the fabrication process.
Figure 4D:
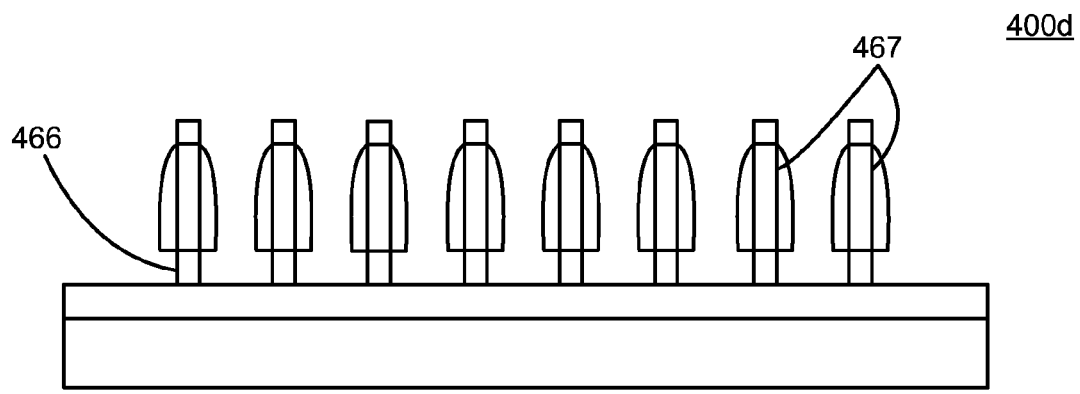
FIG. 4D is a cross-sectional "slice" view (cross-hatching omitted for clarity of illustration purposes), cutting transversely across the gate structures, of the fourth embodiment circuitry taken at another intermediate stage in the fabrication process.
Figure 4E:
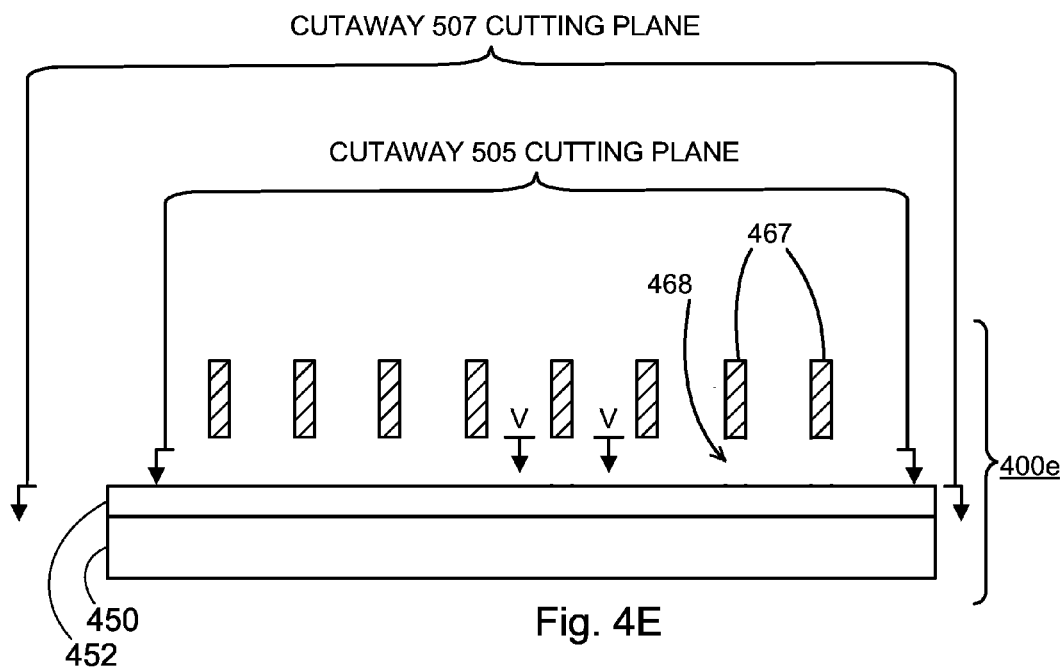
FIG. 4E is a cross-sectional view (cross-hatching included for clarity of illustration purposes), cutting transversely across the gate structures, of the fourth embodiment circuitry taken at another intermediate stage in the fabrication process.

FIGS. 4A to 4E respectively show intermediate sub-assemblies 400a to 400e, which are sub-assemblies as they appear at certain points during the fin-base-removal process. As shown in FIGS. 4A to 4E, devices 400a to 400e collectively include: Si (silicon) wafer 450; SOI (silicon on insulator) 451; BOX (buried oxide) 452; hard mask (nitride or oxide to pattern wire/fin regions) 454; etch trenches 456; deposit spacer material 458; spacer etch region 460; recess etch region 462; Ge/SiGe (germanium/silicon germanium) epitaxy region 464; Ge condensation (high Ge content) region 466; fin structures 467; and empty space regions 468. At the juncture in the fabrication process of intermediate sub-assembly 400e, suspended fin portions of fin structures 467 are suspended over empty space regions 468, as shown in FIG. 4E.

Figure 5:
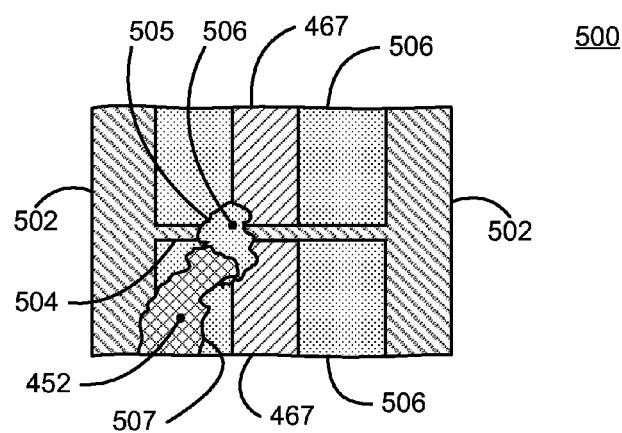
FIG. 5 is a partially cutaway, cross-sectional view (cross-hatching included for clarity of illustration purposes), with a cutting plane parallel to the plane of the device (that is, a plan view), of the fourth embodiment circuitry.

As shown in FIG. 5, finished semiconductor device 500 includes: suspended fin structure 467 (also sometimes referred to as upper portion of fin); silicide layers 502; suspended nanowire structure 504; and interlayer dielectric layer 506. By reviewing FIGS. 4E and 5 in tandem, it can be seen that in finished semiconductor device 500, suspended nanowire structure is in electrical contact with the upper portion of the fin structure so that the upper portion of the fin structure can act as a conductor channel between a source and a drain, while suspended nanowire 504 acts as a gate. Cutaway portions 505 and 507 show how in finished semiconductor device interlayer dielectric layer 506 fills the space between: (i) the buried oxide layer (see cutaway portion 507); and (ii) undersides of upper fin portion 467 and nanowire structure 504. This dielectric, located between the BOX and the underside of upper fin portion 467, suspends the upper fin portion (which is no longer truly a "fin" because its lower portion has been etched away) and nanowire structure 504 so that they are: (i) in electrically conductive contact with each other; but (ii) electrically insulated from the BOX. On other hand, for the nFET devices (not shown in FIG. 5), the fin is left intact so that the nFET fins: (i) continue to extend upward from a top surface of the BOX; and (ii) remain in electrically conductive contact with the BOX. In this way, the suspended conductor channel pFET devices will have a lower drive strength relative to the intact-fin nFET device(s).

Figure 6:
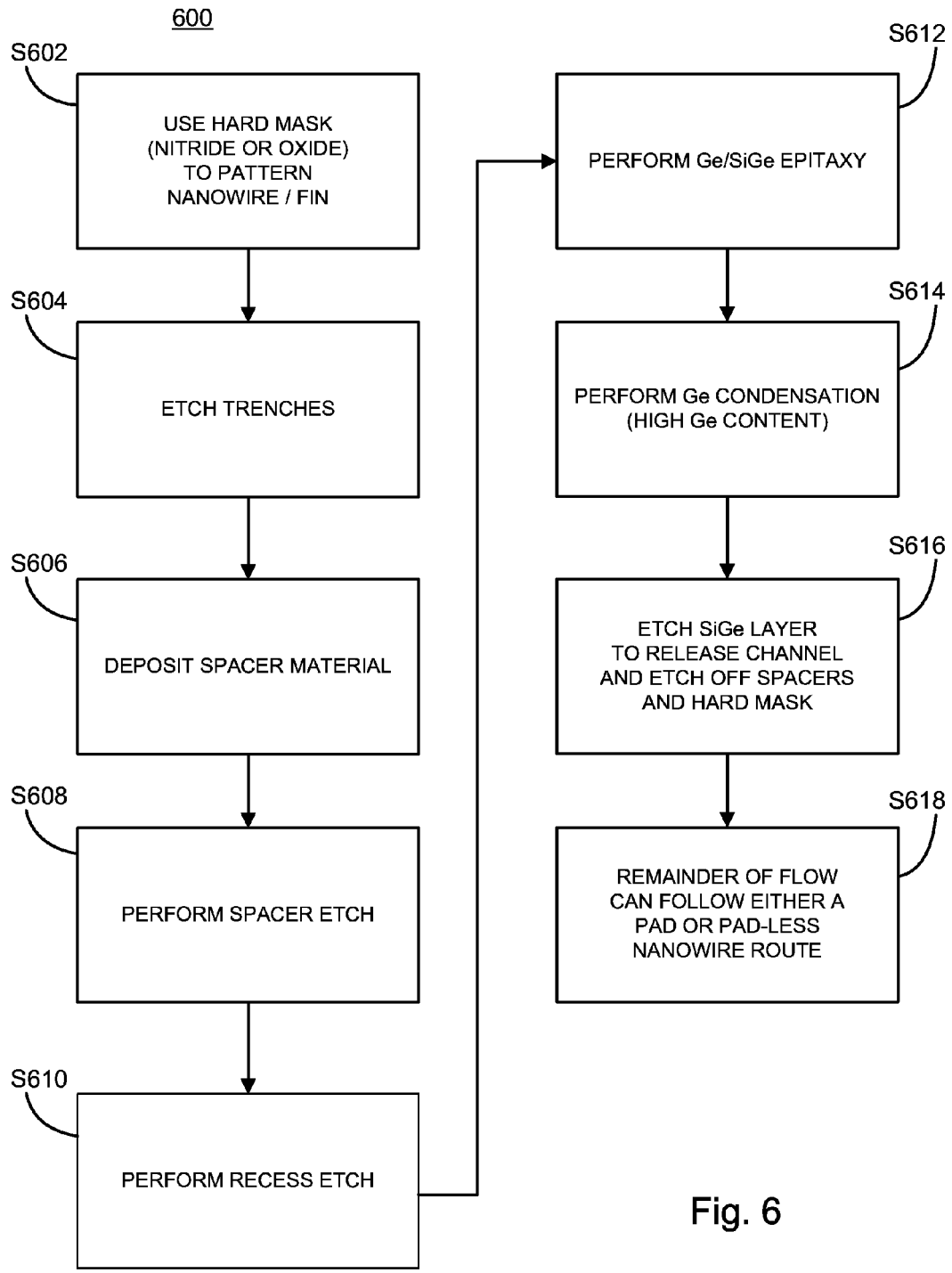
FIG. 6 is a flowchart of a first circuitry fabrication method according to the present invention.

As shown in FIG. 6, flow chart 600 depicts a method according to the present invention. The manufacturing process begins at operation S602 where a hard mask 454, using nitride or oxide, is used to pattern the nanowire/fin. This process occurs prior to intermediate sub-assembly 400a.

The manufacturing process continues to operation S604 where initial etching of the trenches 456 is performed. This process occurs prior to intermediate sub-assembly 400a.

The manufacturing process continues to operation S606 where deposition of spacer material 458 is performed. This process occurs prior to intermediate sub-assembly 400a.

The manufacturing process continues to operation S608 where spacer etch 460 is performed. The manufacturing process continues to operation S610 where recess etch 462 is performed. Operations S608 and S610, taken together, refine intermediate sub-assembly 400a into intermediate sub-assembly 400b, and can be best seen by comparing FIGS. 4A and 4B.

The manufacturing process continues to operation S612 where Ge and/or SiGe epitaxy is performed to make Ge and/or SiGe epitaxy regions 464 (see FIG. 4C). The fin and/or trench regions are hard masked (hard mask not necessarily shown) prior to epitaxy so no epitaxial growth occurs in those regions.

The manufacturing process continues to operation S614 where Ge condensation 466 (using a high Ge content) is performed so that Ge atoms flow from Ge and/or SiGe epitaxy regions 464 into Ge condensation (high Ge content) regions 466 of fin structures 467, as shown by intermediate sub-assembly 400d of FIG. 4D.

The manufacturing process continues to operation S616 where etching of the SiGe layer is performed to release the channel (that is, to create empty space regions 468) and also to etch off the spacers 458 and hard mask 454 in order to yield intermediate sub-assembly 400e of FIG. 4E.

The manufacturing process concludes at operation S618 where the remainder of the manufacturing process flow can follow either a pad or pad-less nanowire route resulting in finished device 500 as shown in FIG. 5.

Figure 7A:
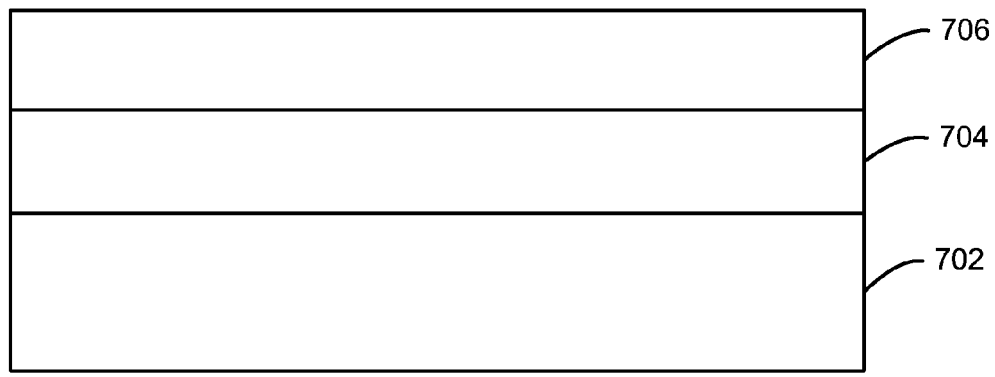
FIG. 7A is a cross-sectional "slice" view (cross-hatching omitted for clarity of illustration purposes), with a cutting plane to be identified, below, in the Detailed Description section, of a fifth embodiment of circuitry according to the present invention taken at an intermediate stage in the fabrication process.
Figure 7B:
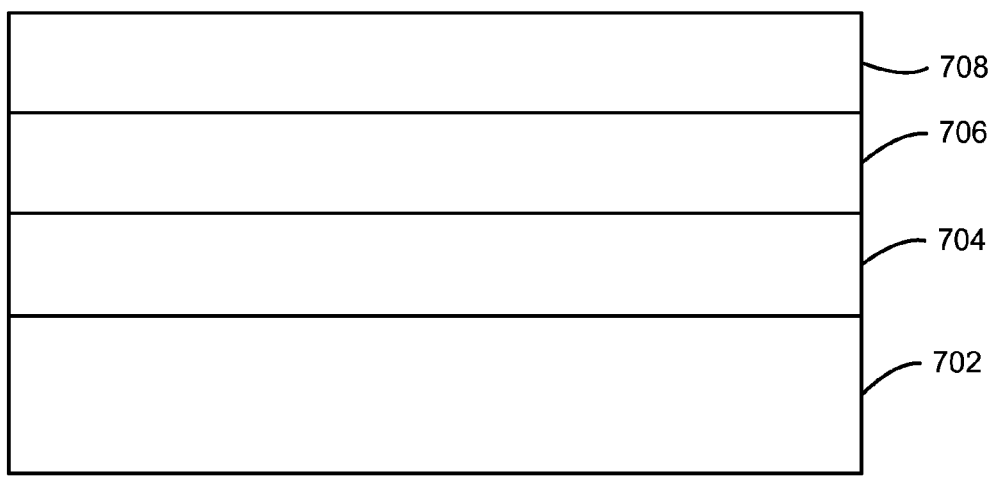
FIG. 7B is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7C:
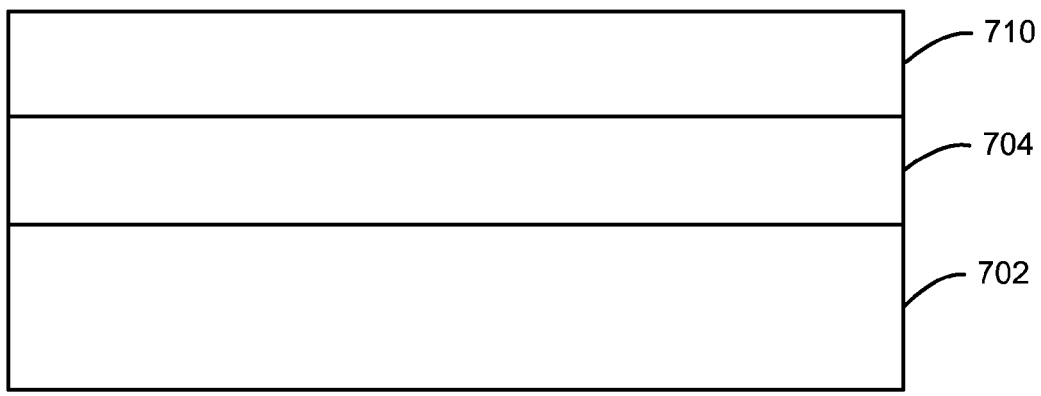
FIG. 7C is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7D:
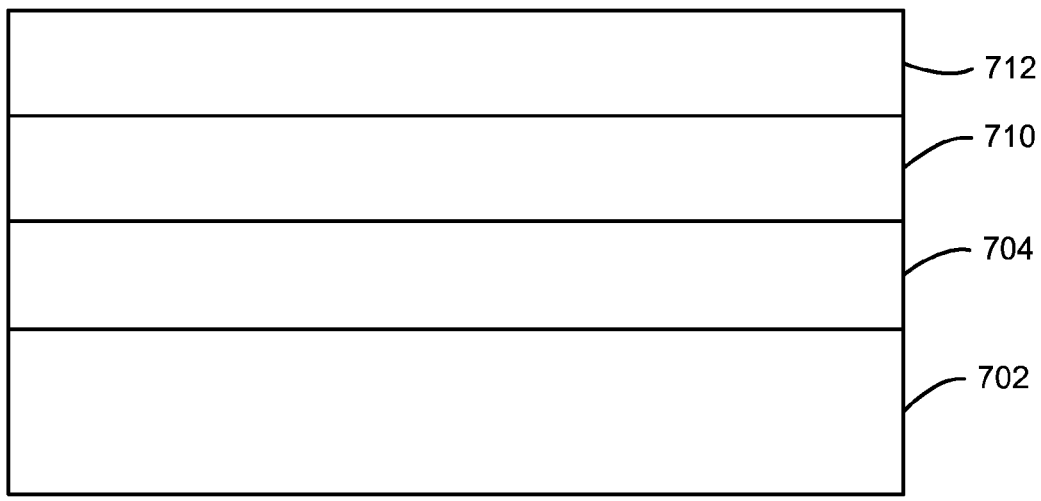
FIG. 7D is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7E:
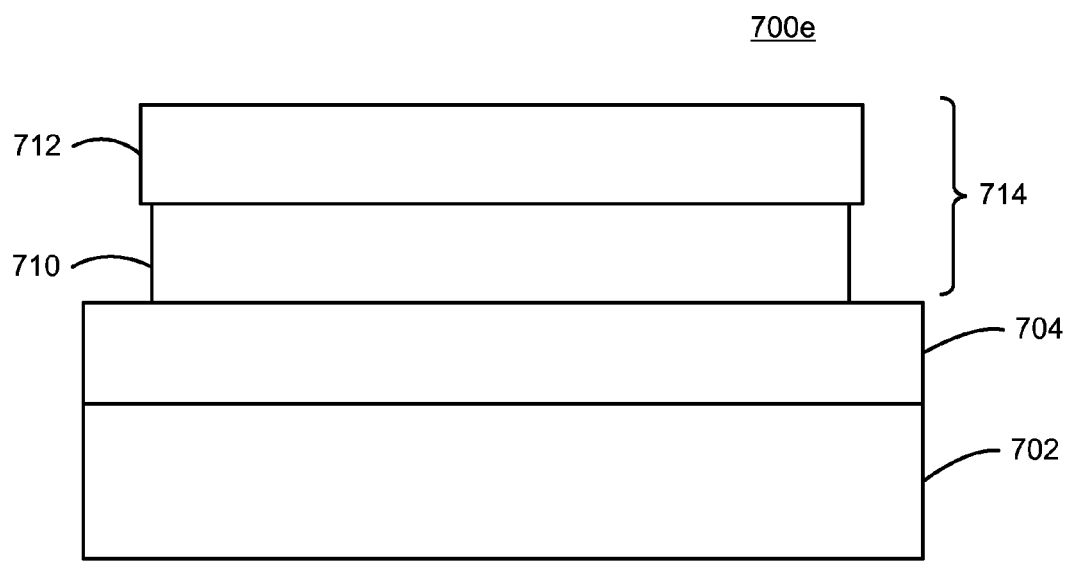
FIG. 7E is a cross-sectional "slice" view (cross-hatching omitted for clarity of illustration purposes), with a cutting plane to be identified, below, in the Detailed Description
Figure 7F:
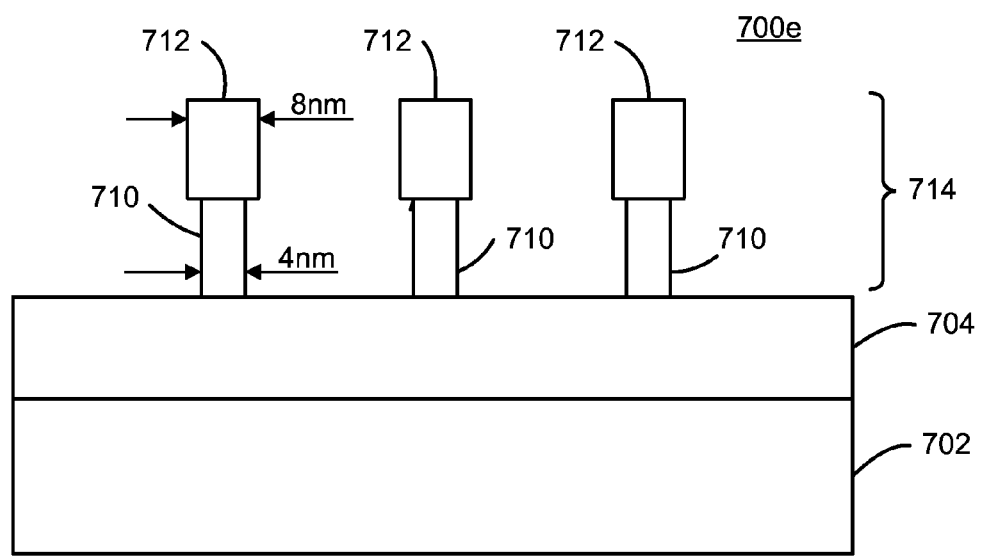
FIG. 7F is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7G:
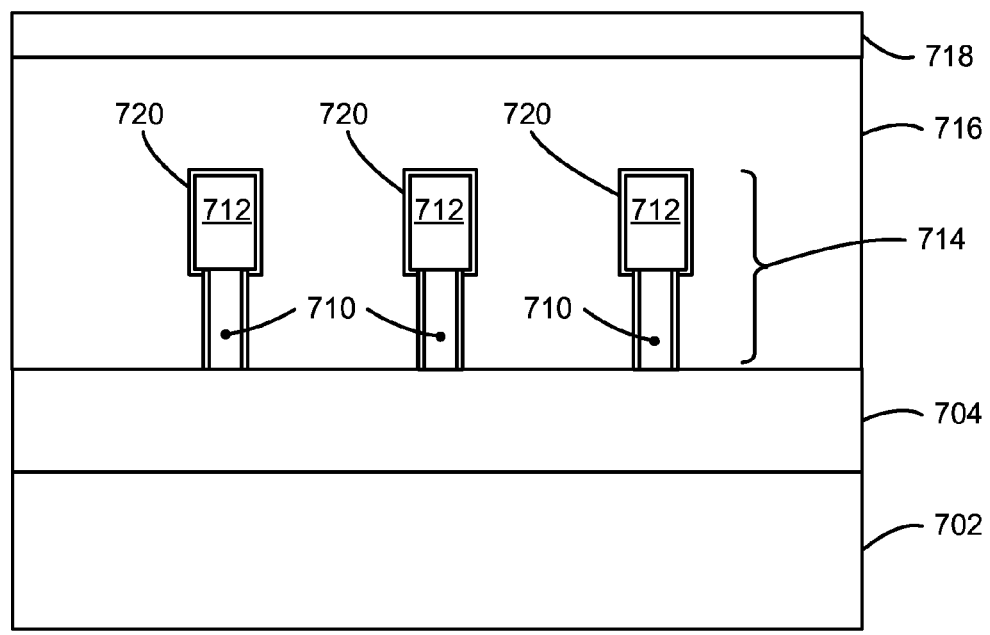
FIG. 7G is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7H:
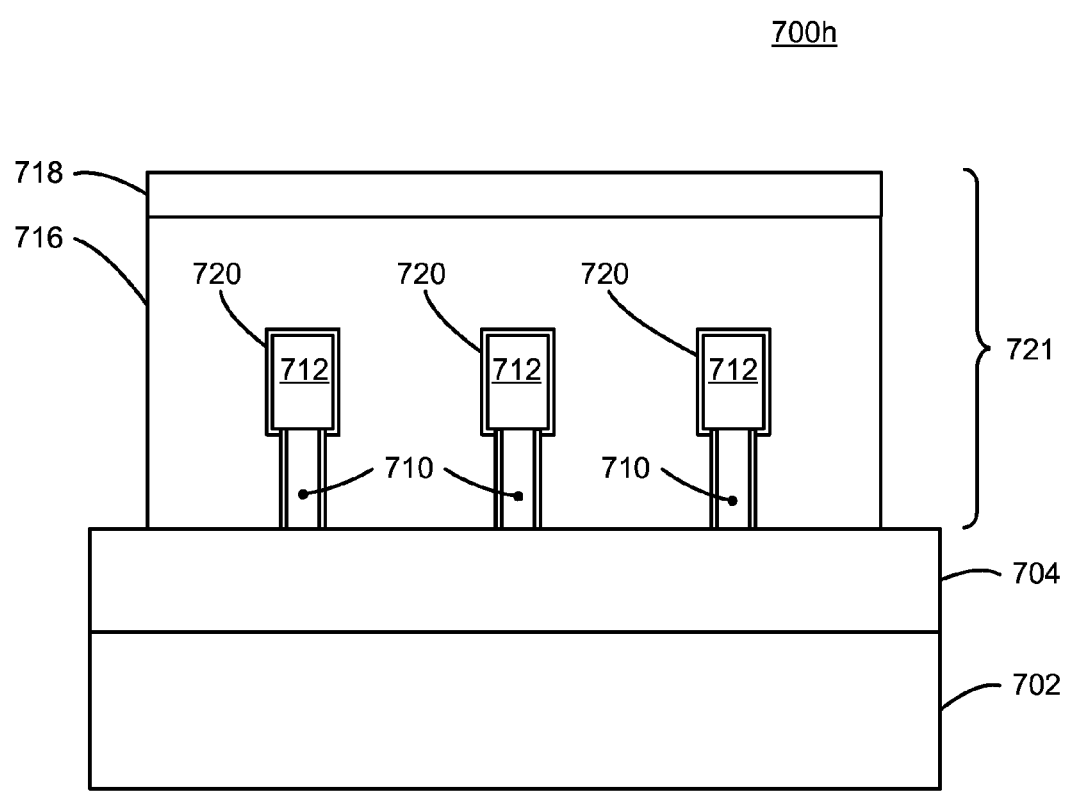
FIG. 7H is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7I:
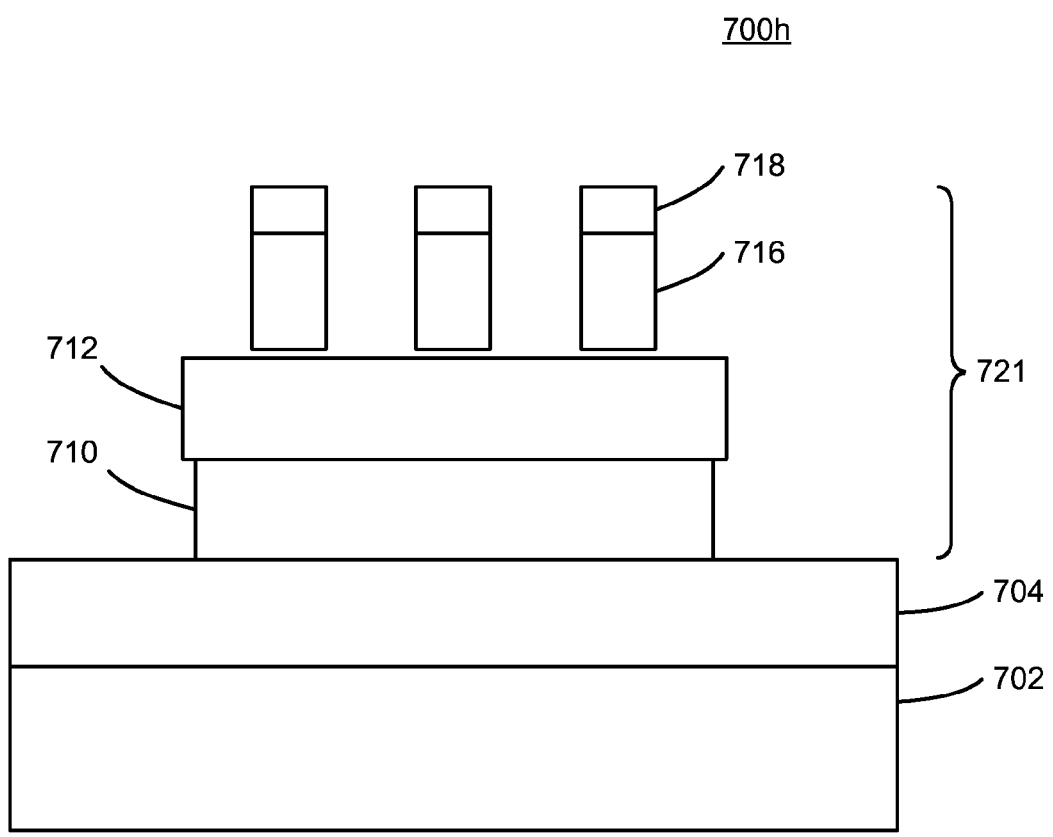
FIG. 7I is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7J:
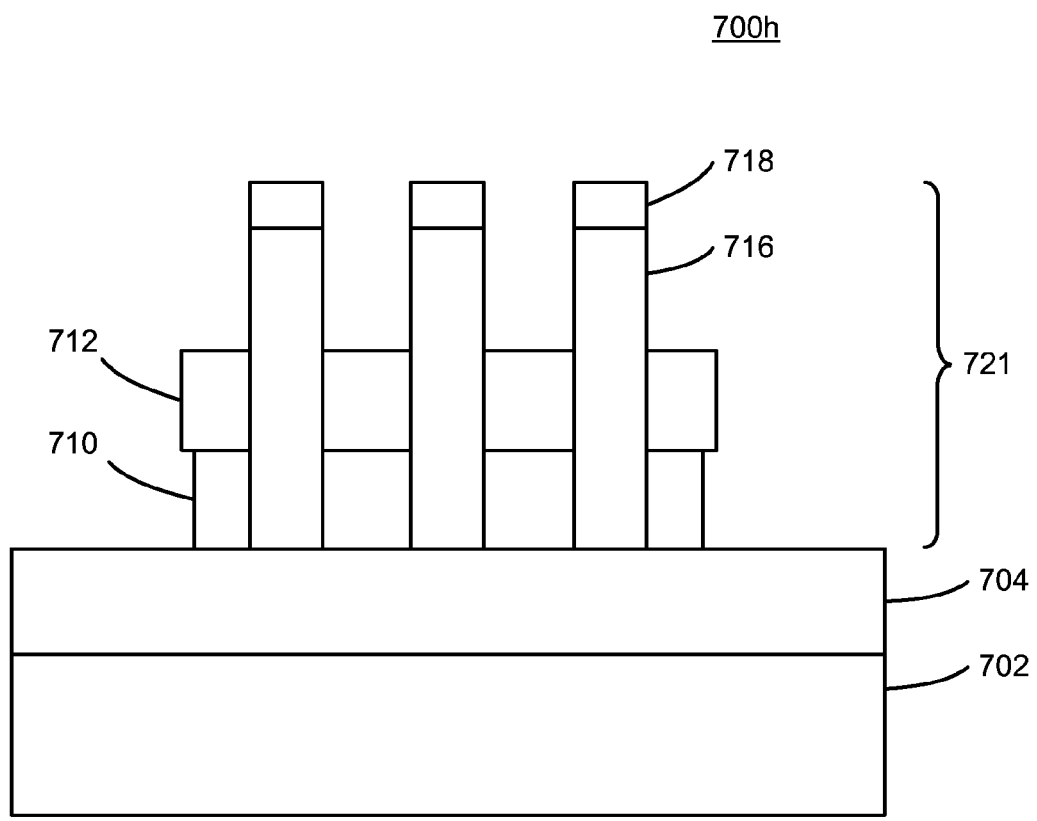
FIG. 7J is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7K:
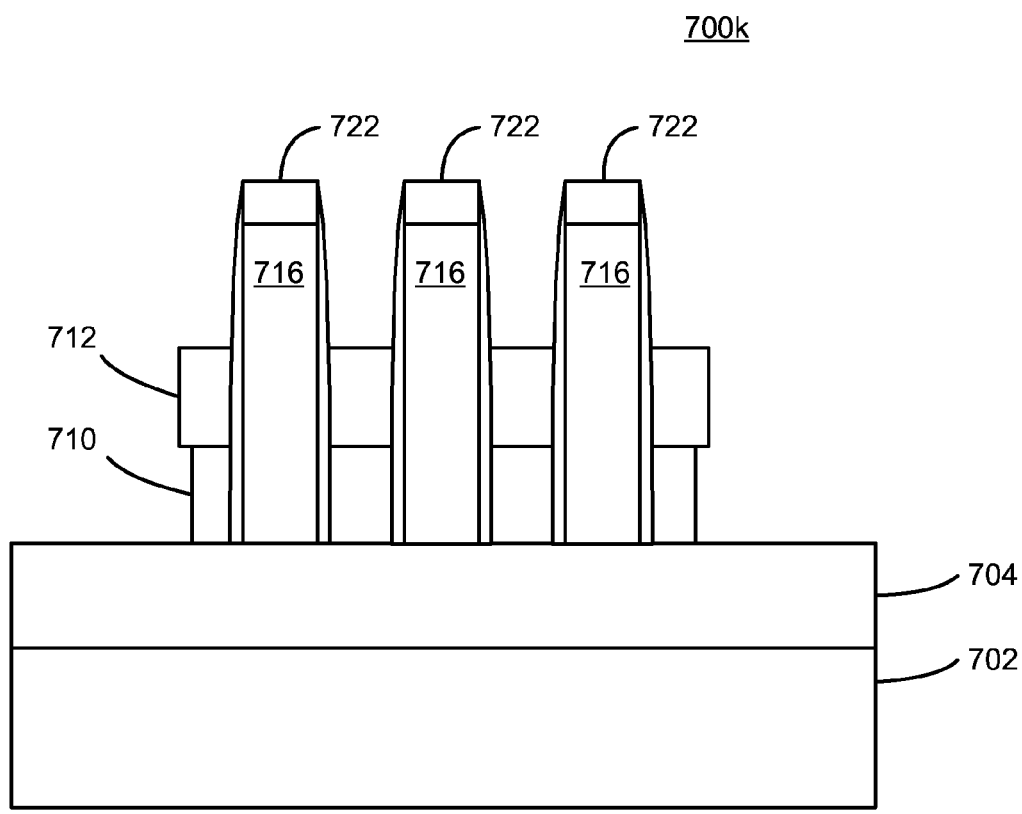
FIG. 7K is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7L:
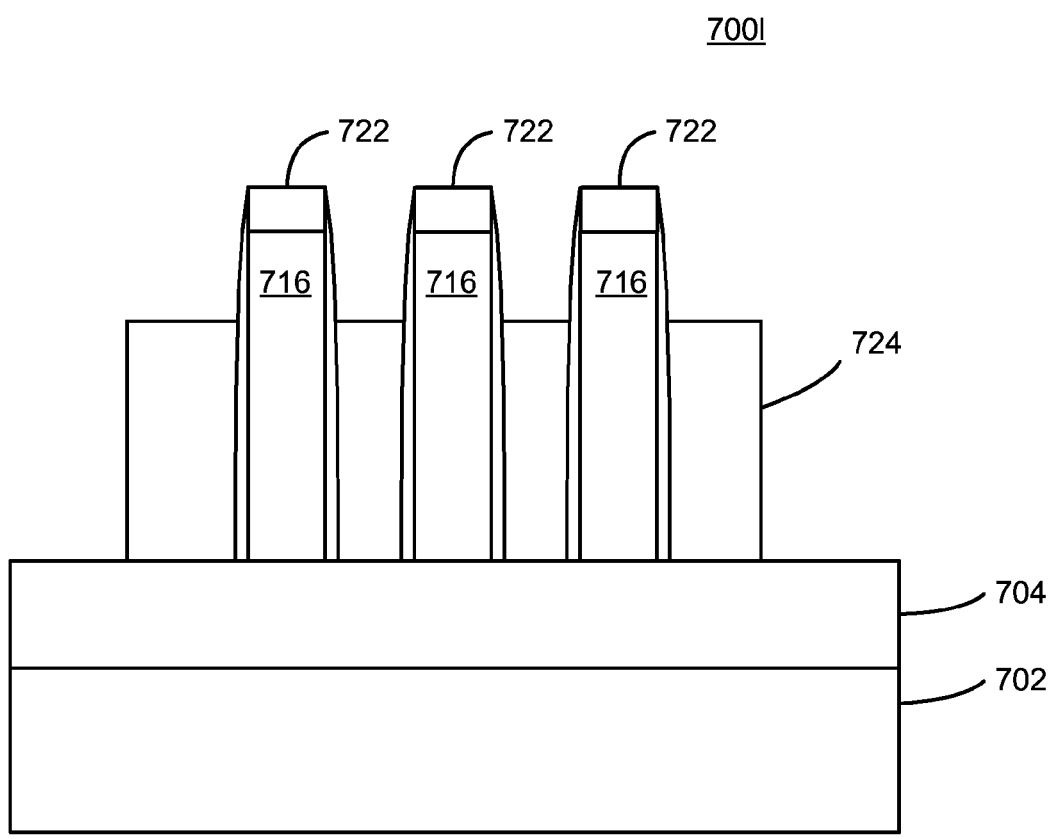
FIG. 7L is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7M:
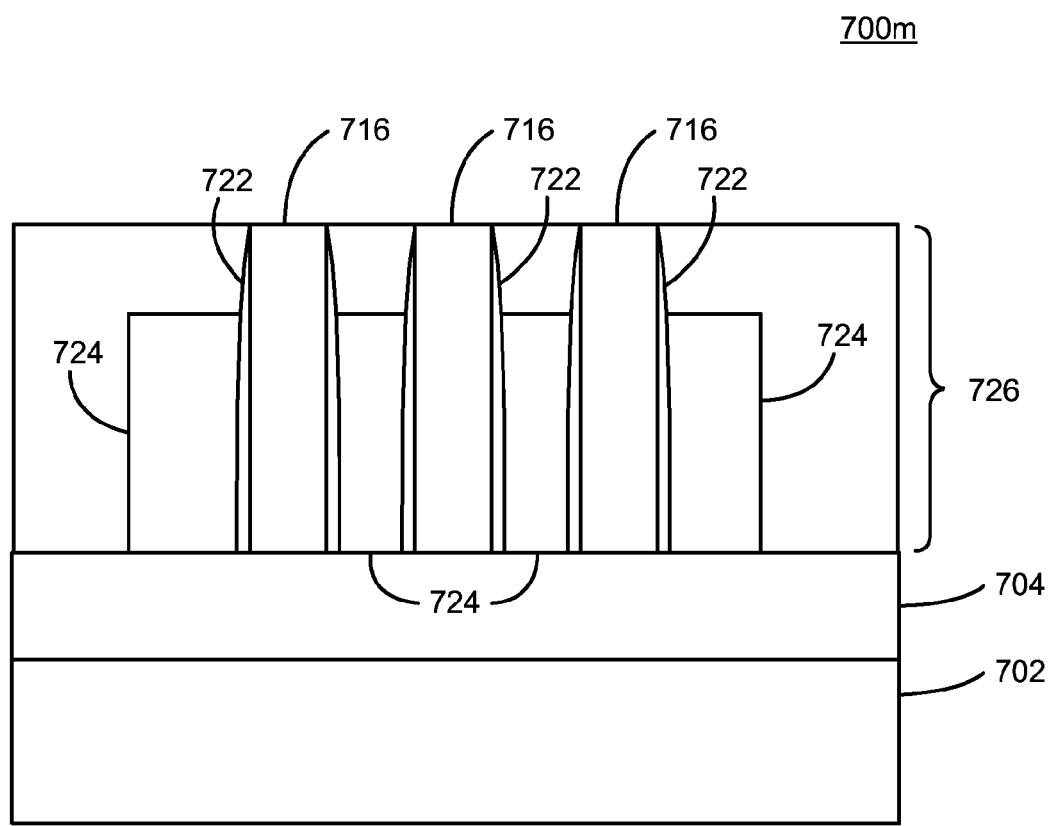
FIG. 7M is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7N:
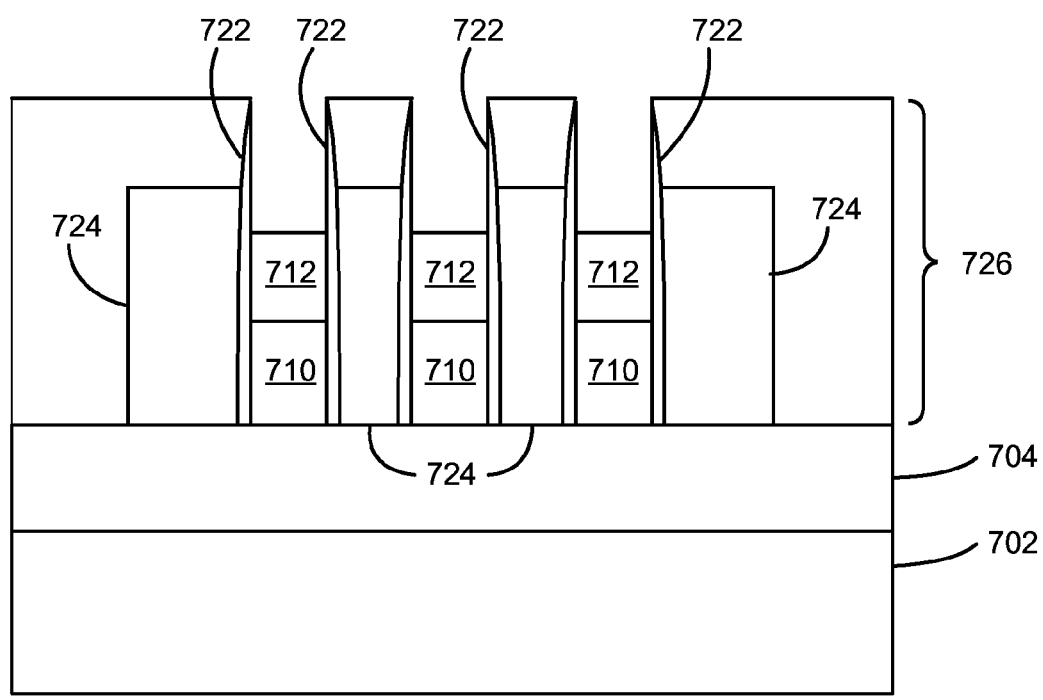
FIG. 7N is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7O:
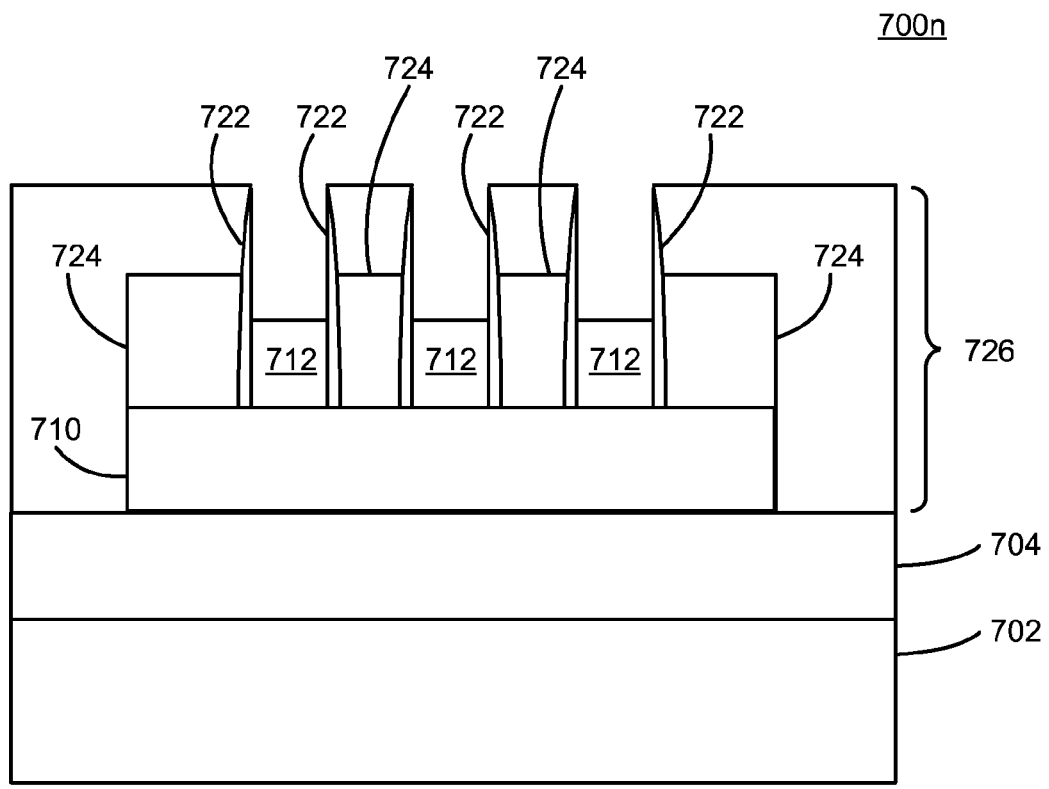
FIG. 7O is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7P:
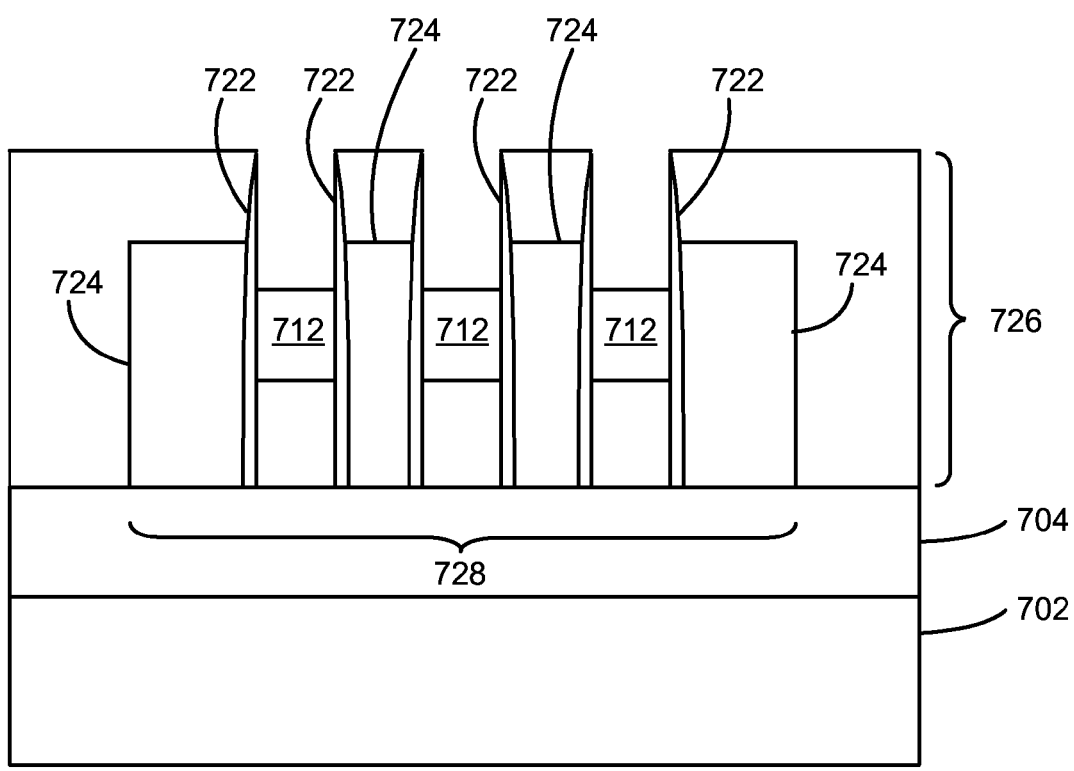
FIG. 7P is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7Q:
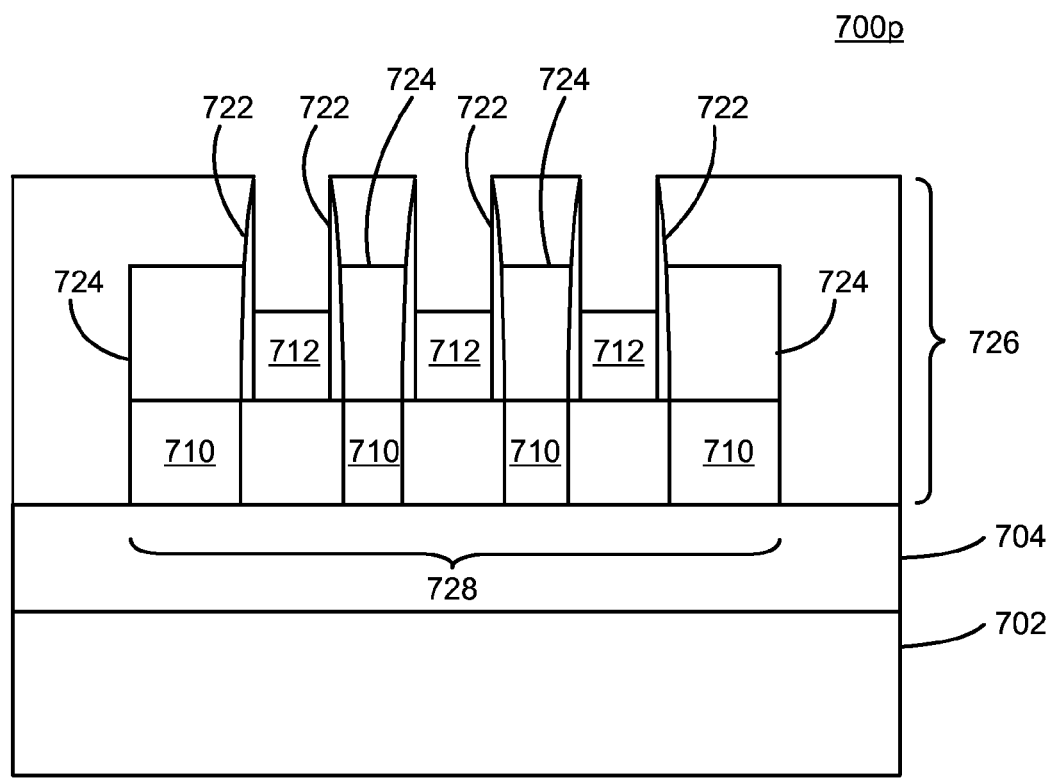
FIG. 7Q is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7R:
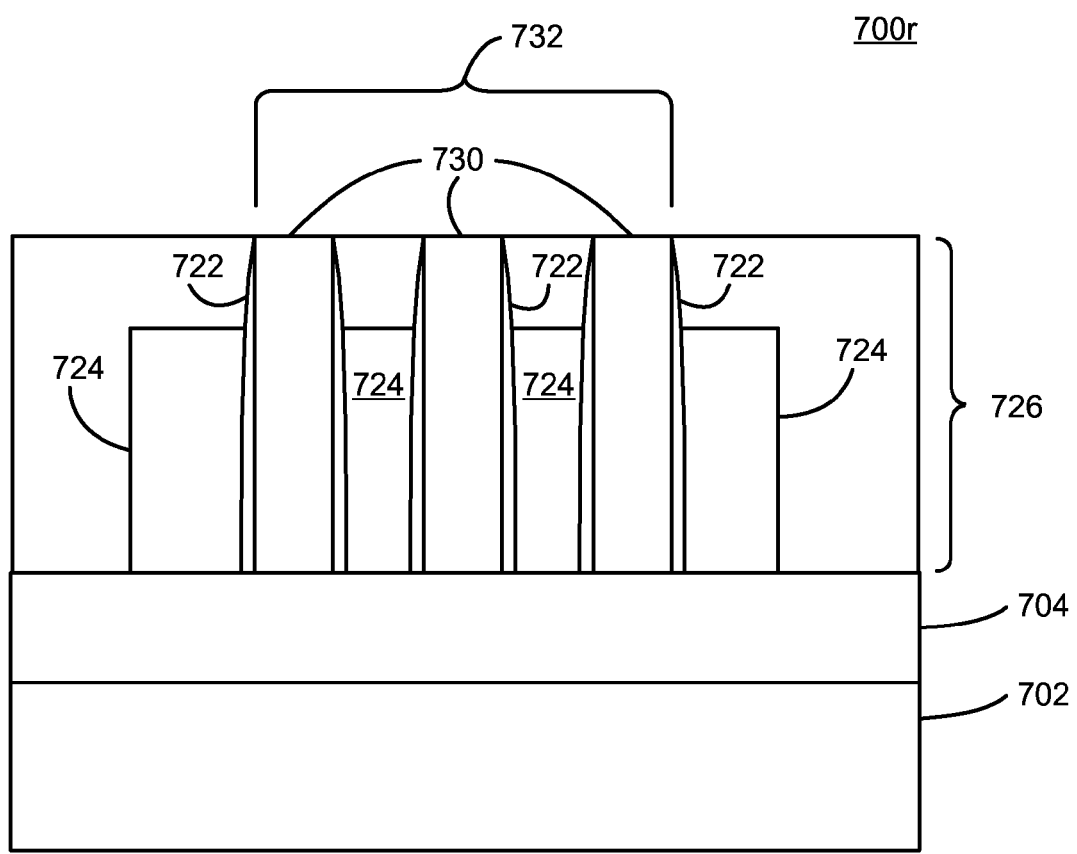
FIG. 7R is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7S:
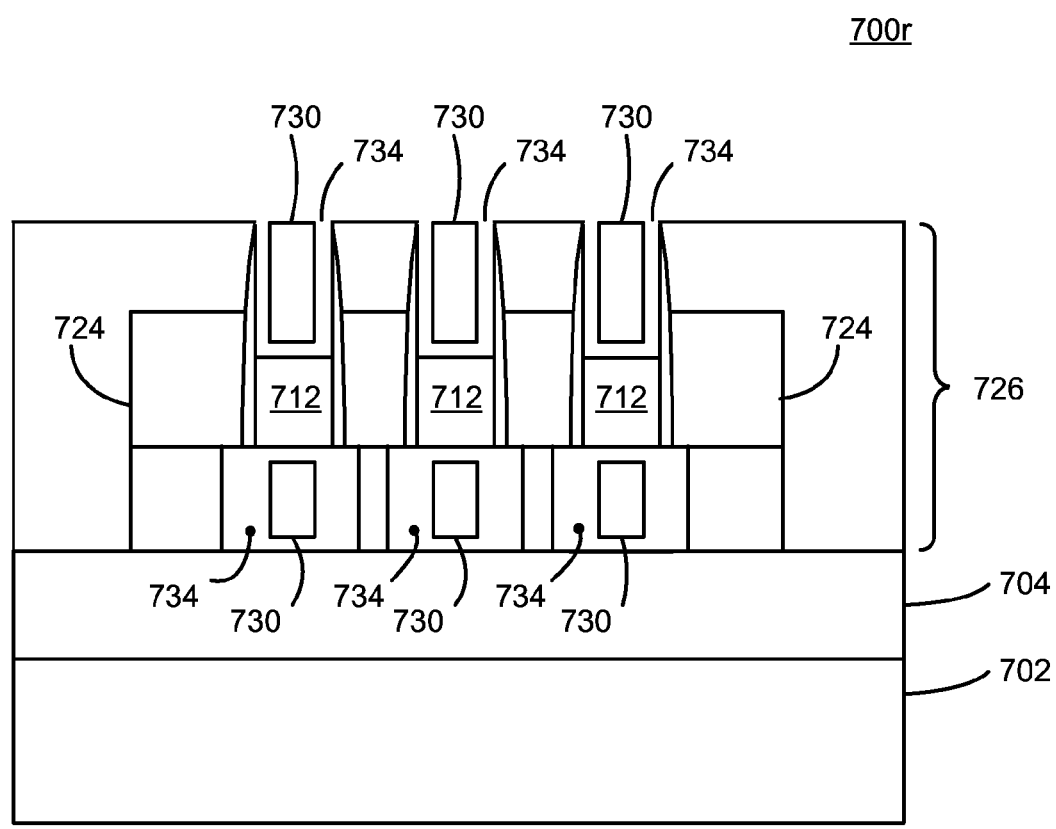
FIG. 7S is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7T:
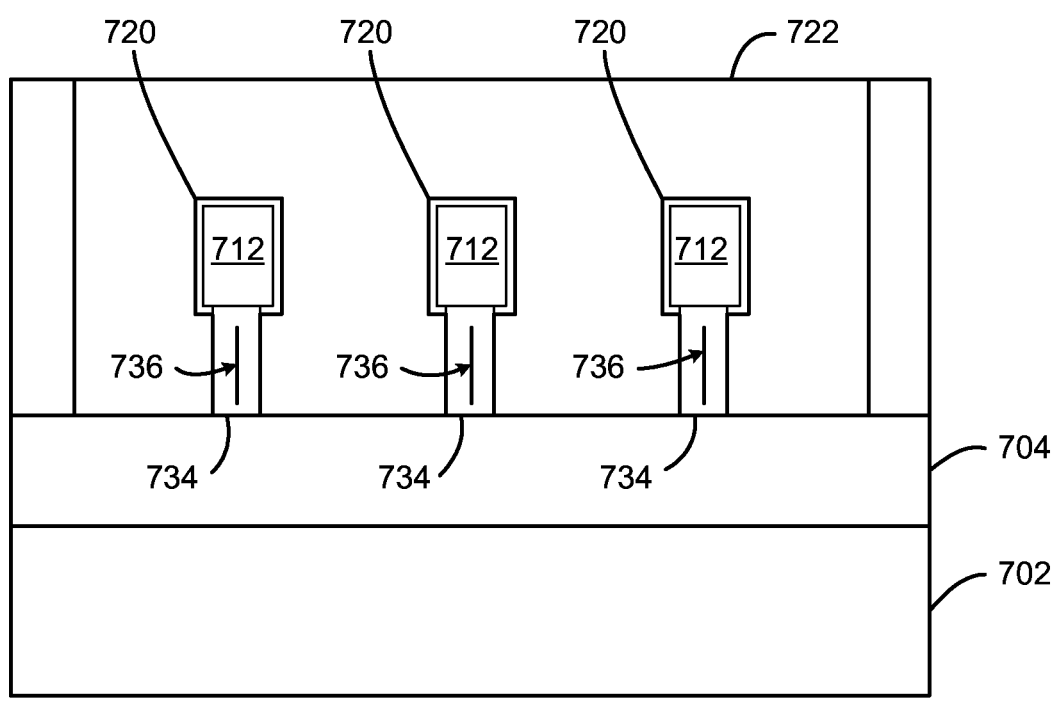
FIG. 7T is a cross-sectional "slice" view (cross-hatching omitted for clarity of illustration purposes), with a cutting plane to be identified, below, in the Detailed Description section, of the fifth embodiment circuitry taken at intermediate stage in the fabrication process.
Figure 7U:
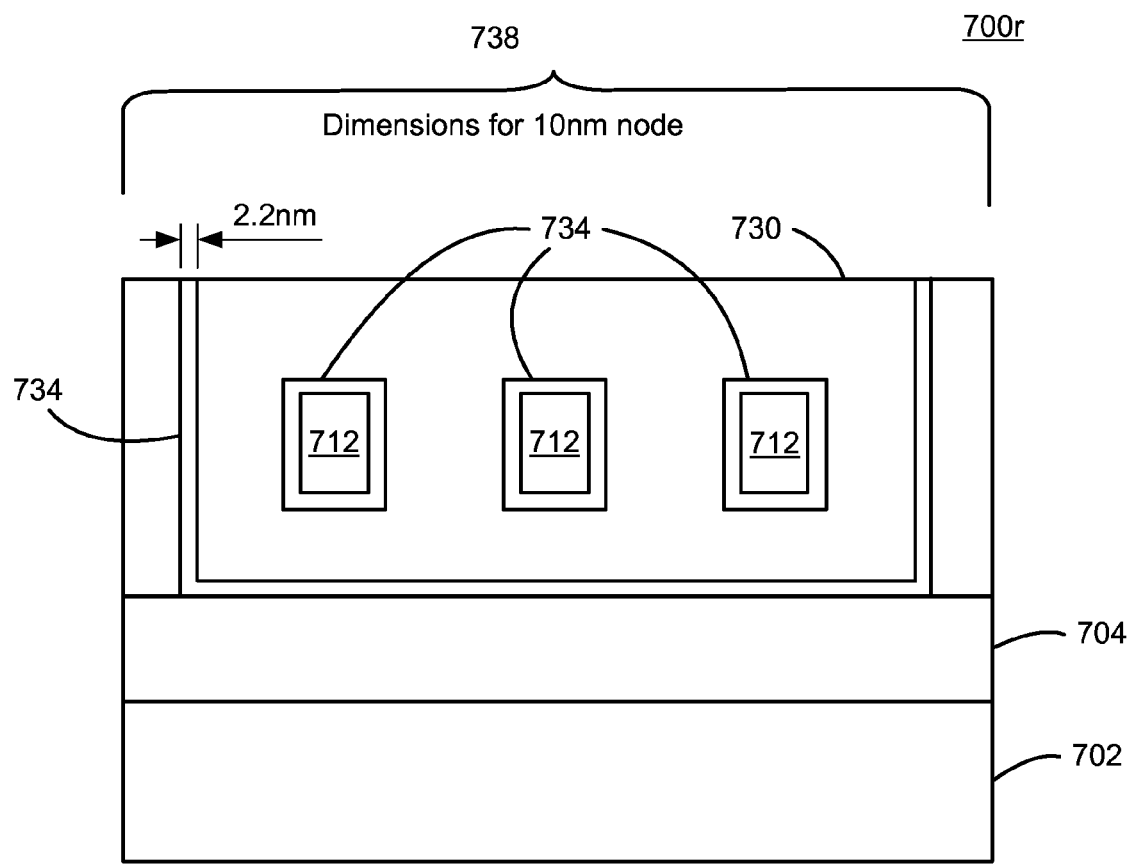
FIG. 7U is a cross-sectional "slice" view (cross-hatching omitted for clarity of illustration purposes), with a cutting plane to be identified, below, in the Detailed Description section, of the fifth embodiment circuitry taken at intermediate stage in the fabrication process.

FIGS. 7A to 7U show intermediate sub-assemblies 700a to 700r. Some intermediate sub-assemblies are shown in more than one figure so that multiple sectional views of the same intermediate sub-assembly can be shown. More specifically, the correlation between intermediate sub-assemblies and figures is as follows: (i) intermediate sub-assembly 700a is shown in FIG. 7A; (ii) intermediate sub-assembly 700b is shown in FIG. 7B; (iii) intermediate sub-assembly 700c is shown in FIG. 7C; (iv) intermediate sub-assembly 700d is shown in FIG. 7D; (v) intermediate sub-assembly 700e is shown in FIGS. 7E and 7F; (vi) intermediate sub-assembly 700g is shown in FIG. 7G; (vii) intermediate sub-assembly 700h is shown in FIGS. 7H, 7I and 7J; (viii) intermediate sub-assembly 700k is shown in FIG. 7K; (ix) intermediate sub-assembly 700l is shown in FIG. 7L; (x) intermediate sub-assembly 700m is shown in FIG. 7M; (xi) intermediate sub-assembly 700n is shown in FIGS. 7N and 7O; (xii) intermediate sub-assembly 700p is shown in FIGS. 7P and 7Q; and (xiii) intermediate sub-assembly 700r is shown in FIGS. 7R, 7S, 7T and 7U. Note that under this numbering scheme, the letter suffix of the figure number does not always correspond to the letter suffix of the reference numeral for the intermediate sub-assembly shown in a given figure.

Intermediate sub-assemblies 700a, 700b, 700c, 700d, 700e, 700g, 700h, 700k, 700l, 700m, 700n, 700p and 700r collectively include: Si substrate layer 702; BOX layer 704; SOI layer 706; SiGe layer 708; condensed SiGe layer 710; epitaxial applied Si layer 712; fin etch 714; poly Si layer 716; SiN (silicon nitride) hard mask layer 718; dummy oxide layer 720; dummy gate patterning 721; spacer layer 722; RSD (raised drain/source) layer 724; gapfill plus planarization region 726; wire release by SiGe etch region 728; gate metal 730; gate stack (and planarization) 732; gate dielectric 734; dielectric pinched off area 736; and 10 nm (nanometer) node 738. With respect to the cross-sectional views of FIGS. 7A to 7U, the cross-sectional planes are as follows: (i) FIGS. 7A to 7E, 7I, 7O, 7Q and 7S are each based on a cross-sectional plane that runs longitudinally through the center-plane of a fin structure (and transversely through three gate structures); (ii) FIGS. 7F to 7H and 7U are each based on a cross-sectional plane that runs longitudinally through the center-plane of an elongated gate (and transversely across three fin structures); (iii) FIGS. 7J to 7N 7P and 7R are each based on a cross-sectional plane that runs parallel to the elongation of the fin structures, but which runs through a region located between two adjacent fin structures (and transversely across three gates); and (iv) FIG. 7T is based on a cross-sectional plane that runs parallel to the elongation of the fin structures, through a spacer layer 722 located along a portion of a lateral wall of the fin structure (and transversely across three gate structures).

Figure 8:
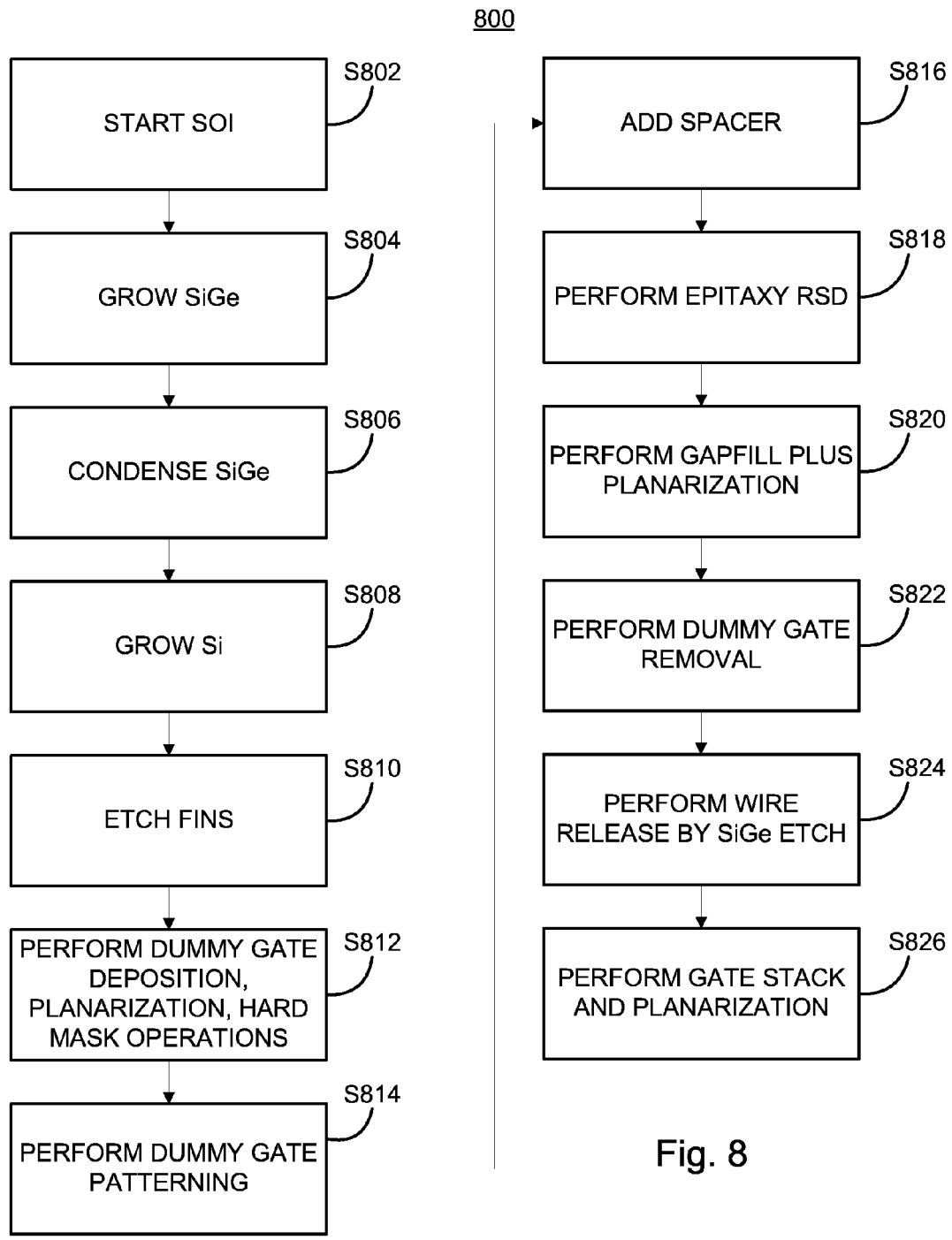
FIG. 8 is a flowchart of a second circuitry fabrication method according to the present invention.

As shown in FIG. 8, flow chart 800 depicts a method of fabricating a semiconductor device (sometimes herein referred to as a replacement gate flow method) according to an embodiment of the present invention. In the following paragraphs, the fabrication method of flowchart 800 will be discussed with reference to intermediate sub-assemblies 700a to 700u, respectively of FIGS. 7A to 7U.

The manufacturing process begins at operation S802 where the SOI layer 706 is applied on top of the BOX layer 704 which is applied over the starting Si substrate layer 702 (see sub-assembly 700a of FIG. 7A).

The manufacturing process continues to operation S804 where growing the SiGe layer 708 on top of the SOI layer 706 is performed (see sub-assembly 700b of FIG. 7B).

The manufacturing process continues to operation S806 where condensing the SiGe layer 710 is performed (see sub-assembly 700c of FIG. 7C).

The manufacturing process continues to operation S808 where Si layer 712 is grown on top of the condensed SiGe layer 710 using an epitaxial process (see sub-assembly 700d of FIG. 7D).

The manufacturing process continues to operation S810 where the fin etch process is performed to yield fin structures 714 (see FIGS. 7E and 7F). Intermediate sub-assembly 700f shows the dimensions for a 10 nm (nanometer) node associated with fin structures 714.

The manufacturing process continues to operation S812 where the following operations are performed: (i) dummy gate deposition to deposit dummy oxide layer 720; (ii) planarization by poly Si layer 716; and (iii) SiN hard mask deposition to deposit SiN (silicon nitride) hard mask layer 718 (see sub-assembly 700g of FIG. 7G).

The manufacturing process continues to operation S814 where the dummy gate patterning operation is performed to yield dummy gate patterning 721 (see FIGS. 7H, 7I and 7J).

The manufacturing process continues to operation S816 where adding spacer layer 722 is performed (see sub-assembly 700k of FIG. 7K).

The manufacturing process continues to operation S818 where RSD (raised source/drain) layer 724 is epitaxially grown SiN (see sub-assembly 700l of FIG. 7L).

The manufacturing process continues to operation S820 where the gapfill and planarization operations are performed (see sub-assembly 700m of FIG. 7M).

The manufacturing process continues to operation S822 where the dummy gate removal operation is performed (see FIGS. 7N and 7O).

The manufacturing process continues to operation S824 where a wire release operation is performed using a SiGe etch process (see FIGS. 7P and 7Q).

The manufacturing process concludes at operation S826 where the gate stack and planarization operation is performed (as shown in FIGS. 7R, 7S, 7T and 7U), including: (i) gate metal 730 is added; and (ii) gate dielectric 734 is added. Note the dielectric 734 pinch off area 736 in sub-assembly 700t using a high-k deposition (high-k>gap/2). Finally, device 700u shows the final dimensions for a 10 nm node.

Figure 9:
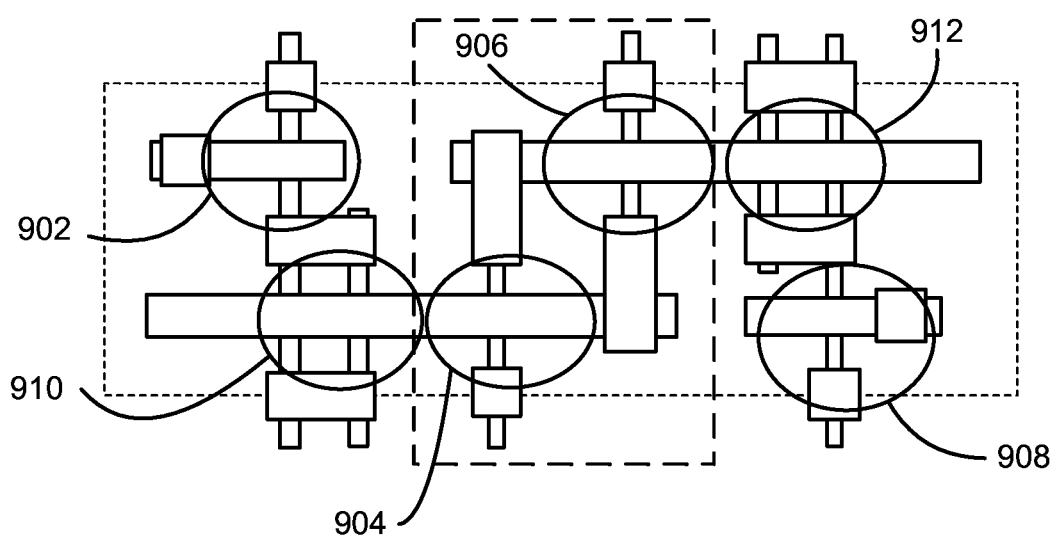
FIG. 9 is a block diagram of a sixth embodiment of circuitry according to the present invention with cross-hatching patterns used to distinguish the different types of circuitry components.

As shown in FIG. 9, device 900 (shown in plan view) includes: single fin transistors 902, 904, 906, 908; and 2 fin transistors 910, 912.

FIG. 9, device 900 again shows an embodiment of a hybrid III-V 6 transistor FINFET SRAM. In this example, device 900 is a 6T (transistor) fin-only design. Note that 4 of the 6 transistors are single fin (902 (pass-gate), 904 (pull-up), 906 (pull-up), 908 (pass-gate)) and 2 of the transistors are 2 fin transistors (910 (pull-down) and 912 (pull-down)). The pull-down transistors utilize 2 fins to make sure it is much "stronger" than the pull-up transistor. If the pull-up transistor is made "weaker" by reducing its perimeter by suspending it, then the pull-down transistor could be reduced to a single fin.

Some embodiments of the present invention may include one, or more, of the following features, characteristics and/or advantages: (i) a suspension layer is used to form the channel; (ii) the structure is a hybrid structure; and (iii) nanowires are supported by structure (anchor pads).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A semiconductor device comprising:
   a buried oxide layer (BOX);
   a first pFET (p-type field-effect transistor) device including a source, a drain, a gate and a conducting channel, with the semiconductor conducting channel extending from the source to the drain and being in electrically conductive contact with the gate; and
   a first nFET (n-type field effect transistor) device including a source, a drain, a gate and a conducting channel, with the semiconductor conducting channel extending from the source to the drain and being in electrically conductive contact with the gate;
   wherein:
   the conducting channel of the first pFET device is: (i) located above the BOX, and (ii) substantially electrically insulated from the BOX; and
   the conducting channel of the first nFET device is in the form of a fin extending upwards from, and in electrically conductive contact with, the BOX.

2. The semiconductor device of claim 1 wherein:
   the gate of the first pFET device is in the form of suspended nanowire.

3. The semiconductor device of claim 1 wherein:
   the gate of the first pFET device and the gate of a second nFET device are two different longitudinal portions of an elongated and continuous piece of material.

4. The semiconductor device of claim 1 further comprising:
   a dielectric material portion located to extend in the space between: (i) the BOX, and (ii) an underside of the gate of the first pFET device and an underside of the conducting channel of the first pFET device.

5. A static random-access memory (SRAM) cell device comprising:
   a buried oxide layer (BOX);
   a first pFET (p-type field-effect transistor) device including a source, a drain, a gate and a conducting channel, with the semiconductor conducting channel extending from the source to the drain and being in electrically conductive contact with the gate; and
   a first nFET (n-type field effect transistor) device including a source, a drain, a gate and a conducting channel, with the semiconductor conducting channel extending from the source to the drain and being in electrically conductive contact with the gate;
   wherein:
   the conducting channel of the first pFET device is: (i) located above the BOX, and (ii) substantially electrically insulated from the BOX; and
   the conducting channel of the first nFET device is in the form of a fin extending upwards from, and in electrically conductive contact with, the BOX.

6. The SRAM cell device of claim 5 wherein:
   the gate of the first pFET device is in the form of suspended nanowire.

7. The SRAM cell device of claim 5 wherein:
the gate of the first pFET device and the gate of the second nFET device are two different longitudinal portions of an elongated and continuous piece of material.

8. The SRAM cell device of claim 5 further comprising:
a dielectric material portion located to extend in the space between: (i) the BOX, and (ii) an underside of the gate of the first pFET device and an underside of the conducting channel of the first pFET device.

9. The SRAM cell device of claim 5 further comprising:
a second pFET (p-type field-effect transistor) device including a source, a drain, a gate and a conducting channel, with the semiconductor conducting channel extending from the source to the drain and being in electrically conductive contact with the gate; and
a second nFET (n-type field effect transistor) device including a source, a drain, a gate and a conducting channel, with the semiconductor conducting channel extending from the source to the drain and being in electrically conductive contact with the gate;
wherein:
the conducting channel of the second pFET device is: (i) located above the BOX, and (ii) substantially electrically insulated from the BOX; and
the conducting channel of the second nFET device is in the form of a fin extending upwards from, and in electrically conductive contact with, the BOX.

10. The SRAM cell device of claim 9 further comprising:
a third nFET (n-type field effect transistor) device including a source, a drain, a gate and a conducting channel, with the semiconductor conducting channel extending from the source to the drain and being in electrically conductive contact with the gate; and
a fourth nFET (n-type field effect transistor) device including a source, a drain, a gate, a gate and a conducting channel, with the semiconductor conducting channel extending from the source to the drain and being in electrically conductive contact with the gate;
wherein:
the conducting channel of the third nFET device is in the form of a fin extending upwards from, and in electrically conductive contact with, the BOX;
the conducting channel of the fourth nFET device is in the form of a fin extending upwards from, and in electrically conductive contact with, the BOX; and
the third and fourth nFET devices are each structured, located and/or connected to act as a pass gate.

11. The SRAM cell device of claim 10 further comprising:
a fifth nFET (n-type field effect transistor) device including a source, a drain, a gate and a conducting channel, with the semiconductor conducting channel extending from the source to the drain and being in electrically conductive contact with the gate;
wherein:
the conducting channel of the fifth nFET device is in the form of a fin extending upwards from, and in electrically conductive contact with, the BOX; and
the fifth nFET device is structured, located and/or connected to act as a read stack.

* * * * *